US012652959B2

(12) United States Patent
Vrabelj et al.

(10) Patent No.: US 12,652,959 B2
(45) Date of Patent: Jun. 9, 2026

(54) PIEZOELECTRIC ASSEMBLY AND PROCESS OF FORMING A PIEZOELECTRIC ASSEMBLY

(71) Applicant: TDK Electronics AG, Munich (DE)

(72) Inventors: Marko Vrabelj, Apace (SI); Sebastian Redolfi, Graz (AT)

(73) Assignee: TDK ELECTRONICS AG, Munich (DE)

( * ) Notice: Subject to any disclaimer, the term of this patent is extended or adjusted under 35 U.S.C. 154(b) by 629 days.

(21) Appl. No.: 17/753,244

(22) PCT Filed: Jun. 2, 2021

(86) PCT No.: PCT/EP2021/064775
§ 371 (c)(1),
(2) Date: Feb. 24, 2022

(87) PCT Pub. No.: WO2021/249844
PCT Pub. Date: Dec. 16, 2021

(65) Prior Publication Data
US 2023/0354710 A1 Nov. 2, 2023

(30) Foreign Application Priority Data
Jun. 9, 2020 (DE) .......................... 102020115315.5

(51) Int. Cl.
*H10N 30/00* (2023.01)
*B06B 1/06* (2006.01)
(Continued)

(52) U.S. Cl.
CPC ......... *H10N 30/708* (2024.05); *C01G 25/006* (2013.01); *G02B 26/0858* (2013.01);
(Continued)

(58) Field of Classification Search
CPC .... H02N 2/186; H10N 30/708; H10N 30/079; H10N 30/204; H10N 30/8554; G02B 26/0858; B06B 1/0603; C01G 25/0006
See application file for complete search history.

(56) References Cited

U.S. PATENT DOCUMENTS

| | | | |
|---|---|---|---|
| 4,946,710 A | 8/1990 | Miller | |
| 2003/0197174 A1 | 10/2003 | Matsuda | |

(Continued)

FOREIGN PATENT DOCUMENTS

| | | |
|---|---|---|
| CN | 101043066 A | 9/2007 |
| CN | 101593807 A | 12/2009 |

(Continued)

OTHER PUBLICATIONS

Schneller, T. et al.; "Chemical solution deposition of functional oxide thin films"; Springer-Verlag Wien; copyright 2013; ISBN: 978-3-211-99311-8 (eBook); DOI: 10.1007/978-3-211-99311-8 (801 pages).

(Continued)

*Primary Examiner* — J. San Martin
(74) *Attorney, Agent, or Firm* — Nixon Peabody LLP

(57) ABSTRACT
A piezoelectric assembly comprises a substrate of Ni, Cu, or steel, a first oriented layer assembled on the substrate, and a piezoelectric layer on the oriented layer. The piezoelectric layer has a degree of orientation with respect to the local surface normal of 90% or more.

22 Claims, 7 Drawing Sheets

(51) Int. Cl.

| | | |
|---|---|---|
| *C01G 25/00* | (2006.01) |
| *G02B 26/08* | (2006.01) |
| *H02N 2/18* | (2006.01) |
| *H10N 30/078* | (2023.01) |
| *H10N 30/079* | (2023.01) |
| *H10N 30/853* | (2023.01) |

(52) U.S. Cl.

CPC ......... *H10N 30/078* (2023.02); *H10N 30/079* (2023.02); *H10N 30/8554* (2023.02); *B06B 1/0603* (2013.01); *C01P 2002/34* (2013.01); *C01P 2002/52* (2013.01); *C01P 2002/72* (2013.01); *C01P 2004/03* (2013.01); *C01P 2006/16* (2013.01); *C01P 2006/40* (2013.01); *H02N 2/186* (2013.01)

(56) References Cited

U.S. PATENT DOCUMENTS

| | | | |
|---|---|---|---|
| 2007/0216264 A1 | 9/2007 | Furukawa et al. |
| 2008/0218560 A1 | 9/2008 | Noguchi |
| 2009/0295255 A1 | 12/2009 | Nagaya et al. |
| 2011/0309721 A1 | 12/2011 | Moler |
| 2012/0206019 A1 | 8/2012 | Noda |
| 2013/0099627 A1 | 4/2013 | Fujii et al. |
| 2014/0085694 A1 | 3/2014 | Aga |
| 2014/0091677 A1 | 4/2014 | Noda et al. |
| 2014/0265734 A1 | 9/2014 | Fox |
| 2015/0028444 A1 | 1/2015 | Noda |
| 2015/0231884 A1 | 8/2015 | Kobayashi |
| 2016/0035961 A1 | 2/2016 | Noda |
| 2017/0110648 A1 | 4/2017 | Doi et al. |
| 2018/0033950 A1 | 2/2018 | Doi |
| 2018/0329493 A1 | 11/2018 | Khoshkava |
| 2020/0052190 A1 | 2/2020 | Nahm |

FOREIGN PATENT DOCUMENTS

| | | | |
|---|---|---|---|
| CN | 103000802 A | 3/2013 |
| CN | 103187520 A | 7/2013 |
| CN | 104851970 A | 8/2015 |
| CN | 106133932 A | 11/2016 |
| CN | 108039407 A | 5/2018 |
| DE | 102013110440 A1 | 4/2014 |
| EP | 1282901 B1 | 11/2006 |
| EP | 2955166 A1 | 12/2015 |
| GB | 201604457 | 9/2017 |
| JP | H11204849 A | 7/1999 |
| JP | 2003282988 A | 10/2003 |
| JP | 2006058180 A | 3/2006 |
| JP | 2006114745 A * | 4/2006 |
| JP | 2007273799 A | 10/2007 |
| JP | 2009054994 A | 3/2009 |
| JP | 2012533274 A | 12/2012 |
| JP | 2016001662 A | 1/2016 |
| JP | 2016152237 A | 8/2016 |
| JP | 2018198315 A | 12/2018 |
| WO | WO-2009023100 A2 * | 2/2009 | ............ H03H 9/131 |
| WO | 2013021614 A1 | 2/2013 |
| WO | WO 2017/202652 A1 | 11/2017 |
| WO | WO 2020/084066 A1 | 4/2020 |

OTHER PUBLICATIONS

International Search Report and Written Opinion of International Searching Authority corresponding to International Patent Application No. PCT/EP2021/064775, mailed Sep. 22, 2021 (9 pages).

Sung Sik Won et al.; "Flexible vibrational energy harvesting devices using strain-engineered perovskite piezoelectric thin films"; Nano Energy, vol. 55, pp. 182-192; Oct. 31, 2018; XP055841780; ISSN: 2211-2855; DOI: 10.1016/j.nanoen.2018.10.068 (13 pages).

Balma, D. et al.; "High Piezoelectric Longitudinal Coefficients in Sol-gel PZT, Thin Films Multilayers"; J. Am. Ceram. Soc. 97 [7], pp. 2069-2075; 2014; DOI: 10.1111/jace.12894 (8 pages).

Hong Goo Yeo et al.; "Oriented piezoelectric films prepared by chemical solution deposition on Ni foils"; J. Appl. Phys. 116, 014105; Jul. 7, 2014; https://doi.org/10.1063/1.4886597 (6 pages).

Matavz, A. et al.; "Self-assembled porous ferroelectric thin films with a greatly enhanced piezoelectric response"; Applied Materials Today, vol. 16, pp. 83-89; 2019 (7 pages).

Schneller, T. et al.; "Chemical modifications of $Pb(Zr_{0.3},Ti_{0.7})O_3$ precursor solutions and their influence on the morphological and electrical properties of the resulting thin films"; J. Sol-Gel Sci. Techn. vol. 42, pp. 337-352; Mar. 7, 2007; DOI: 10.1007/s10971-007-0764-2 (16 pages).

Examination Report in Japanese Patent Application No. 2022-513419, dated May 16, 2023, in Japanese (6 pages).

Examination Report in Chinese Patent Application No. 202180005276.7, dated Oct. 26, 2025, in Chinese (12 pages).

Examination Report in Chinese Patent Application No. 202180005276.7, dated Mar. 31, 2026, in Chinese (4 pages).

* cited by examiner

PIEZOELECTRIC ASSEMBLY AND PROCESS OF FORMING A PIEZOELECTRIC ASSEMBLY

RELATED APPLICATIONS

This application is a U.S. National Stage of International Application No. PCT/EP2021/064775 filed on Jun. 2, 2021, which claims the benefit of German Patent Application No. 102020115315.5, filed on Jun. 9, 2020, each of which is hereby incorporated by reference in its entirety.

BACKGROUND OF THE INVENTION

Piezoelectric films and piezoelectric assemblies are used in many applications making use of the direct piezoelectric effect or the converse piezoelectric effect.

For example, piezoelectric assemblies may be used in devices for energy harvesting wherein electrical energy is generated by a deformation of a piezoelectric active material or a piezoelectric layer. Also, piezoelectric assemblies may be applied in haptic detectors where an electrical signal is generated upon a haptical contact. Other examples are micromechanical applications or micromotors where work is performed by applying a voltage to a piezoelectric element.

Due to its widespread application there is a demand for cheap but high performance piezoelectric devices or assemblies. In addition, the assemblies should be robust and compatible with flexible applications.

However, this demand is not satisfactorily met by piezoelectric assemblies or layers prior to this invention.

The preparation of crystalline piezoelectric active materials, in particular of piezoelectric perovskite materials from solutions, is described in detail throughout the literature. For example, a description can be found in U.S. Pat. No. 4,946,710 A.

Perovskite piezoelectric films are typically formed on silicon wafer substrates. The silicon wafer substrates are both expensive, as they are typically made of a single crystalline material. Further, silicon wafers are fragile and therefore can sustain only a minor level of bending.

Nonetheless piezoelectric layers with high piezoelectric response values have been produced on silicon wafer substrates, as for example disclosed in Non-patent literature 1.

For example, high performance piezoelectric films can be prepared from piezoelectric lead zirconate titanate (PZT) thin films. These PZT films show the highest piezoelectric response along the (100) direction of the perovskite crystal unit cell. This means that the longitudinal piezoelectric effect, represented by the d33 value is highest in the films with (100) crystal orientation.

For example for a PZT film on a flat substrate surface, a high degree of orientation of the (100) direction of the PZT crystallites with the surface normal has to be achieved, in order to achieve high piezoelectric response.

Applying a seed layer on the substrate below the PZT film has been a common approach to form highly oriented PZT films. The seed layer is typically a material which grows preferentially with a defined orientation depending on synthesis and processing parameters. This defined orientation can then act as a template for the layers grown above. Typically lanthanum nickelate, strontium ruthenate, lead titanate or also titania films have been applied to form oriented PZT films.

These seed layers have the property that they can be produced with high quality and high preferential orientation on silicon substrates by solution-based techniques, such as sol-gel deposition Due to the disadvantages of silicon wafer substrates preparation of piezoelectric films based on perovskite materials on inexpensive metal substrates, has been attempted, with several examples in the literature.

For example, WO 2017/202652 A1 discloses the sol gel derived preparation of a transparent piezoelectric device. On a transparent substrate, for example glass or fused silica, a transparent PZT film is deployed. Between the transparent substrate and the transparent PZT layer a thin and transparent nucleation layer consisting of metal oxides, for example TiO2, ZrO2, Al2O3 or the like, is arranged. Although the as disclosed PZT film is crystalline, no piezoelectric properties have been reported for the cheap substrates. Only the ferroelectric characteristics of the device and small dielectric losses have been reported.

For example, EP 1 282 901 B1 discloses the sol gel derived preparation of a PZT film on different metal foils, for example brass, platinum, titanium and stainless steel. The application of a barrier layer between the substrate and the PZT film is reported. Although the as disclosed PZT film is crystalline, no piezoelectric properties have been reported for the cheap stainless steel substrate. Only a low dielectric permittivity of below 150 at zero DC field strength has been reported.

For example, WO 2020/084066 A1 discloses the ink-jet-printing derived preparation of a piezoelectric film consisting for example out of PZT, PLZT, LNO or the like. A PZT film is printed on a noble metal substrate, for example Pt, Au, Pd or the like, or on a substrate coated with noble metals, for example platinized silicon, glass or steel. To avoid unwanted spreading of the piezoelectric-film-printing-ink due to excessive wetting on the noble metal surface of the substrate, a SAM-layer consisting of an organic thiol, for example 1-dodecanethiol, is deployed between the noble metal substrate surface and the printed piezoelectric film. The SAM-layer is not present anymore in the final device after thermal treatment and is also not intended to influence the piezoelectric film at all. Although the disclosed PZT film is crystalline, no piezoelectric properties have been reported.

Non-patent literature 2 describes the formation of a PZT thin film on a nickel-chromium-based austenitic steel foil, wherein a lanthanum nickelate buffer layer is applied. However, the PZT film has mixed crystallographic orientation.

Non-patent literature 3 describes the formation of PZT films on a hafnium-oxide coated nickel substrate with a preferential (100) orientation. The high degree of orientation is achieved by an also highly orientated lanthanum nickelate film which is deposited on the hafnium oxide coated substrate previous to PZT film formation.

Despite these approaches no approach has been known in which a perovskite piezoelectric material with high orientation is formed on a cheap metal substrate templated by a seed layer of perovskite structure without any additional further supporting layers or structures.

Further, different thermal expansion coefficients of piezoelectric perovskite films and of the substrate are a problem which is relevant also in the case of cheap metal substrates.

During preparation of piezoelectric films this difference in thermal expansion coefficient can cause high mechanical stresses in the piezoelectric film which may eventually lead to breaking of the film or which at least may diminish the piezoelectric properties due to a clamping effect of the substrate.

In this context, non-patent literature 4 discloses formation of a porous PZT film on silicon substrate which leads to a stress decoupling due to local elastic relaxation in the film stress.

However, no report of the use of porous structures on cheap metal substrates has been reported prior to this application.

Non-Patent Literature

Non-patent literature 1: Davide Balma, Andrea Mazzalai, Nachiappan Chidambaram, Cosmin S. Sandu, Antonia Neels, Alex Dommann, Peter Hess, Dieter Binz, Paul Muralt; *High Piezoelectric Longitudinal Coefficients in Sol-gel PZT Thin Film Multilayers*. Journal of the American Ceramic Society; 2014; Volume 97; Pages 2069-2075.

Non-patent literature 2: Sung Sik Won, Hosung Seo, Masami Kawahara, Sebastjan Glinsek, Jinkee Lee, Yunseok Kim, Chang Kyu Jeong, Angus I. Kingon, Seung-Hyun Kim; *Flexible vibrational energy harvesting devices using strain-engineered perovskite piezoelectric thin films*; Nano Energy; 2019; Volume 55; Pages 182-192.

Non-patent literature 3: Hong Goo Yeo, Susan Trolier-Mckinstry; {001} *Oriented piezoelectric films prepared by chemical solution deposition on Ni foils*; Journal of Applied Physics; 2014; Volume 116; Page 014105.

Non-patent literature 4: Aleksander Matavž, Andraž Bradeško, Tadej Rojac, Barbara Malič, Vid Bobnar; *Self-assembled porous ferroelectric thin films with a greatly enhanced piezoelectric response*; Applied Materials Today; 2019; Volume 16; Pages 83-89.

SUMMARY OF THE INVENTION

The issues addressed above are solved by the subject-matter of the claims of the present application. Further advantageous embodiments are described in the claims. In addition, a process of forming a piezoelectric assembly solving the above-addressed issues is claimed.

As a first aspect a piezoelectric assembly is provided which comprises a base metal substrate which has a main substrate surface. A first oriented layer is arranged on the main substrate surface wherein the first oriented layer comprises a first material of crystalline perovskite structure which constitutes at least 90 wt % of the first oriented layer. Further, a first piezoelectric layer is arranged on the first oriented layer, wherein the first piezoelectric layer comprises a piezoelectric material of crystalline perovskite structure comprising lead, and the piezoelectric material has a larger longitudinal piezoelectric coefficient (d33) along the (100) direction than the first material of the first oriented layer. A degree of orientation o of the crystalline perovskite structure of the first piezoelectric layer is 90% or more. The degree of orientation o is the average degree of alignment of the (100) direction of the unit cells of the crystalline piezoelectric material with the local surface normal N or the main substrate surface.

This assembly provides a high performance piezoelectric film based on a perovskite material comprising lead on a cheap base metal substrate. Typically, these substrates have no preferential crystal orientation, i.e. they can be polycrystalline or amorphous. The substrate may be, for example, a foil or a platelet of the material.

These bendable or flexible substrates allow the preparation of bendable or flexible piezoelectric assemblies, which can sustain bending of up to 90° on a length of 20 mm, for example.

The substrate of this assembly can act as a first electrode, typically together with the oriented layer, which can be conducting.

Preferentially, the first material of crystalline perovskite structure constitutes at least 95 wt % of the first oriented layer, more preferentially 99 wt % and ideally the first oriented layer consist entirely of the first material.

Typically, the first oriented layer does not contribute considerably to the overall piezoelectric response of the piezoelectric assembly. For example, the first oriented layer can be piezoelectrically inactive.

However, the first oriented layer can be a seed layer in the fabrication process of the device. As a seed layer, which consists of a perovskite material, the first oriented layer can act as a template, transferring its orientation to the first piezoelectric layer arranged above. For example, the first oriented layer can be grown with a preferential (100) orientation of the perovskite material which is transferred to the first piezoelectric layer.

Thus, introducing the first oriented layer can enhance the piezoelectric response of the piezoelectric assembly, by aligning the piezoelectric material of crystalline perovskite structure of the first piezoelectric layer.

Further the first oriented layer can act as a buffer layer preventing interfusion of ions or chemical reactions between the substrate and the first piezoelectric layer. Thereby deterioration of the piezoelectric layer due to chemical altering during heating processes, such as annealing can be prevented.

Here and in the following the degree of orientation o is defined as an average alignment of the (100) direction of perovskite crystallites of the first piezoelectric layer with the local surface normal N of the main substrate surface. The local surface normal N is the surface normal of a tangent plane of the main substrate surface at a certain point of the main substrate surface.

In one embodiment the substrate of the piezoelectric assembly has a second surface opposite to the main substrate surface and a layered structure comprising a piezoelectric layer on a oriented layer is arranged on the second substrate surface in analogy to the first piezoelectric layer on the first oriented layer which is assembled on the main substrate surface.

This means for a case, in which the substrate is a flat film or platelet, a symmetrical structure is formed, with the mirror plane lying in the middle between main and second substrate surface.

In a case in which the substrate is not flat, symmetry is typically maintained along the direction of the local surface normal N of the main substrate surface.

In a further embodiment of the piezoelectric assembly a second oriented layer comprising the same first material of crystalline perovskite structure as the first oriented layer is arranged above the first piezoelectric layer. Further in this embodiment, a second piezoelectric layer is arranged on the second oriented layer wherein the second piezoelectric layer comprises the same piezoelectric material with the same degree of orientation o of 90% or more as the first piezoelectric layer.

This means that the second piezoelectric layer can be identical to the first piezoelectric layer. Typically, also the second piezoelectric layer has a degree of orientation o of at least 90%.

Arranging further piezoelectric layers on the substrate, either on a second surface or above a first piezoelectric layer, has the advantage that the overall piezoelectric strength of the assembly can be enhanced without enhancing too much the thickness of one piezoelectric layer. Comparatively thick piezoelectric layers tend to strongly deform during a converse piezoelectric effect or a direct piezoelectric effect The separation of layers of piezoelectric material by non-piezoelectrically active layers, in this case the oriented layers, can help to prevent this strong overall deformation of the device or the piezoelectric assembly.

In such a structure, the second oriented layer can act as an internal electrode, in the case when the second oriented layer is electrically conductive.

In principle additionally a further metal electrode layer can be also arranged between the first piezoelectric layer and the second oriented layer.

In a further embodiment of the piezoelectric assembly the first oriented layer comprises a porous oriented sub-layer which has a porous structure with a relative porosity of up to 70%.

Porosity can be understood such that the porous oriented sub-layer comprises the first material and pores and the volume fraction of the pores in the porous oriented sub-layer may be up to 70%, which means that up to 70% of the volume of the porous oriented sub-layer may consist of pores. Thus, this definition can be considered analogously to the definition of relative density for a bulk material. For example the porous oriented sub-layer may have a porosity of up to 50%, preferentially.

In principle, the entire first oriented layer can consist of the porous oriented sub-layer.

By the porous oriented sub-layer compressive stress or tensile stress appearing due to the different thermal expansion coefficients of the first piezoelectric layer and the substrate can be compensated. Thus deterioration of the piezoelectric effect due to a substrate clamping effect can be reduced.

This means the oriented layer can have a templating, buffering and stress releasing effect.

In another embodiment of the piezoelectric assembly, the first oriented layer comprises at least one dense oriented sub-layer besides the porous oriented sub-layer. In this embodiment the porous oriented sub-layer has an at least two times higher concentration of pores than the dense oriented sub-layer.

In such a configuration, the dense oriented sub-layer can act as an efficient buffer preventing ion interdiffusion between substrate and the first piezoelectric layer, due to its dense morphology.

The porous oriented sub-layer can provide the stress releasing function.

Typically also the dense oriented sub-layer does not necessarily have a density of 100%, which may result from the preparation procedure based upon deposition techniques from solution. However, the density of the dense oriented sub-layer is typically at least two times higher than the density of the porous oriented sub-layer.

In a further embodiment of the piezoelectric assembly, at least one dense oriented sub-layer is arranged directly on the main substrate surface and the porous oriented sub-layer is arranged on the dense oriented sub-layer.

Placing the dense oriented sub-layer directly on the main substrate surface can prevent diffusion of ions from the substrate directly at the main substrate surface. Thus the buffering can be efficient.

In a further embodiment a further dense oriented sub-layer is arranged on the porous oriented sub-layer.

This means that the porous oriented sub-layer can be sandwiched between two dense oriented sub-layers.

This can bring about the additional advantage that a dense closed surface is in direct contact with the first piezoelectric layer. Thereby the dense oriented sub-layer can act as an efficient template for the first piezoelectric layer.

If an assembly comprises more than one oriented layer, these additional oriented layers may be structured analogously to the first oriented layer.

In one embodiment of the piezoelectric assembly the average pore size of the porous oriented sub-layer is 100 nm or below.

Pore sizes below 100 nm allow that closed layers can be prepared on the porous oriented sub-layer.

Preferably the average pore size can range between 1 nm to 20 nm. In this case preparation of closed and compact layers above the porous oriented sub-layer can be even more efficient.

In a further embodiment of the piezoelectric assembly the first material is selected from the group consisting of lanthanum nickelate (LaNiO3), strontium ruthenate (SrRuO3) and lead titanate (PbTiO3).

These materials can be prepared with high degree of orientation dependent on for example concentration of coating solutions or processing parameters during chemical solution deposition based fabrication methods. Thus these materials they can efficiently act as a template.

These materials allow for the preparation of both, dense and porous oriented sub-layers. Further they efficiently buffer between the substrate and the first piezoelectric layer. Also they allow for efficient templating of preferential orientations, in particular of the (100) orientations for the piezoelectric material.

Of these first materials, lanthanum nickelate (LaNiO3) is particularly favored.

In a further embodiment of the piezoelectric assembly the first material of the first oriented layer has at least the same degree of orientation o of 90% or more as the crystalline perovskite structure of the first piezoelectric layer.

With a degree of orientation o of over 90% the first oriented layer can be an efficient template, which can promote the crystallites of the piezoelectric layer to grow in (100) orientation, resulting in the piezoelectric material with (100)-orientation degree o of 90% or more in the first piezoelectric layer.

Even more favorable is a degree of orientation for the first material of the first oriented layer of 95% or above or, even better, of 99% or above.

In the case of a layered oriented layer, typically, all sublayers each have a degree of orientation o of 90% or more.

In a further embodiment of the piezoelectric assembly the first oriented layer has a thickness of 10 nm to 500 nm.

Within this thickness range the first oriented layer can act as an efficient buffer between the piezoelectric layer and the substrate. For thinner films, in particular for porous thinner oriented layers, the buffering may not be efficient.

Further, films of this thickness can be prepared with a high degree of orientation o and also thicknesses in this range can be prepared efficiently by chemical solution deposition based techniques.

Higher thicknesses than those addressed above can require extended preparation efforts which cause inefficient preparation processes. Further, also the film quality may deteriorate for films with thicknesses above 500 nm.

In a further embodiment of the piezoelectric assembly the substrate is titanium (Ti), aluminium (Al), nickel (Ni), copper (Cu) or preferentially a steel.

These materials are cheap and allow for preparation of a first oriented layer on it.

Nickle-chromium based austenitic steels are particularly favored as substrate materials because they are crystalline, cheap and can resist oxidation efficiently. This can be relevant during preparation of typical materials of the oriented layer, which typically is conducted under oxygen-containing atmosphere. This also may allow for application in a corrosive environment.

In this sense the nickel-chromium-based austenitic steels are favoured, especially, over nickel or copper based materials, which have lower oxygen resistivity.

Furthermore, nickel-chromium-based austenitic steels are also particularly suited as they are reversibly flexible and bendable.

In a further embodiment of the piezoelectric assembly the first piezoelectric layer consists exclusively of the piezoelectric material which is represented by [Pb1−ySly] [(ZrxTi1−x)1−zS2z]O3 wherein S1 is a first substituent and S2 is a second substituent. x is chosen between 0.40 and 0.95. y is smaller than 0.30, and z is smaller than 0.15. Preferably, y is smaller than 0.25. Preferably at least one of y, and z is larger than 0. Even more preferred y and z are larger than 0.

In [Pb1−yS1y][(ZrxTi1−x)1−zS2z]O3 the first substituent S1 partially occupies A-Sites of the perovskite unit cell (general formula ABO3) partially replacing lead. The second substituent S2 occupies B-Sites of the perovskite unit cell partially replacing zirconium or titanium ions.

For example S1 may be one or more selected from a group consisting of Na, K, Ag, Ba, La, Sr, Ca, Nd, Y, Eu, Gd, Tb, and Dy.

For example S2 may be one or more selected from a group consisting of Cu, Ni, Co, Hf, Mg, Mn, Fe, Nb, V and W.

Doped lead titanate materials are particularly favorable perovskite piezoelectric materials.

In particular in the vicinity of the morphotropic phase boundary these materials exhibit the highest magnitude of the dielectric constant and the piezoelectric constants, such as the longitudinal piezoelectric coefficient (d33).

Depending on the degree of substitution and the nature of the substituents, the morphotropic phase boundary at room temperature can be found for x values being between 0.45 and 0.6, which is a preferred range.

The value y can preferably be below 0.10, for example below 0.05 or even 0.02 or below. Particularly favorable dopants are manganese, niobium or lanthanum.

According to a further embodiment of the piezoelectric assembly the first piezoelectric layer can have a thickness of 0.1 μm to 5 μm.

This thickness range can be accessed by chemical solution deposition based techniques.

As a further aspect a device comprising the above-described piezoelectric assembly is provided wherein the piezoelectric assembly is attached to a surface of the device and is configured to generate a haptic signal at the surface.

The described piezoelectric assembly can be applied advantageously in devices for detecting haptic signals, this may be for example touch screen applications.

As a further aspect a device comprising the piezoelectric assembly as described above is provided which also contains an energy storage element wherein the piezoelectric assembly is configured to harvest electrical energy that is generated in the piezoelectric assembly during a mechanical deformation of the piezoelectric assembly and wherein the energy storage element is configured to store the electrical energy harvested by the piezoelectric assembly.

As a further aspect a micromirror comprising the piezoelectric assembly as described above is provided. This micromirror comprises a mirror surface. The mirror surface may be a reflectively prepared surface of the piezoelectric assembly. In another embodiment a mirror having a mirror surface and a back surface opposite to this mirror surface is provided and the piezoelectric assembly is attached to the back surface. In both cases the piezoelectric assembly is configured to bend the micromirror upon voltage application to the piezoelectric assembly.

In particular, in such an application a flexible bendable piezoelectric assembly is advantageous because it bends together with the bendable mirror. Thus, it is possible, with the high precision of piezoelectric devices, to focus or defocus light with such a micromirror setup.

As another aspect, a process of forming the above-described piezoelectric assembly is provided. The process comprises providing a base metal substrate, which has a main substrate surface. Further, this process comprises forming of a first seed layer comprising a first material of crystalline perovskite structure represented by the general formula ABO3 on the main substrate surface including the steps of depositing a first seed layer solution comprising ions of A and B on the main substrate surface and crystallization of the perovskite structure by a first annealing procedure. Further the process comprises forming of a first piezoelectric layer comprising a piezoelectric material of crystalline perovskite structure comprising lead including the steps of depositing a piezoelectric layer solution comprising lead-ions and further ions of the piezoelectric material and crystallization of the perovskite structure comprising lead by a second annealing procedure.

For example, lanthanum nickelate can be the first material. In this case A is La, and B is Ni in the ABO3 crystal structure.

Such chemical solution deposition based techniques are easily applied and cost efficient formation methods of perovskite layers, both for seed layers and piezoelectric layers.

Typically, the individual formation procedures of, for example, the seed layer can comprise several deposition steps. For example it can comprise repeated deposition and annealing of thin sub-layers which together form a crystalline perovskite first seed layer. The same holds in principle for the piezoelectric layer.

Typically, the preparation of the first seed layer and the first piezoelectric layer can further comprise drying and pyrolysis steps.

The seed layer can be prepared with a high degree of orientation o of 90% or more. Thus, by preparing the first piezoelectric layer on the first seed layer, the oriented seed layer can promote crystallization of the perovskite crystallites in (100) direction.

After completion of the piezoelectric assembly including this process the first seed layer can be identified as the first oriented layer.

As an embodiment of the process of forming a piezoelectric assembly the first seed layer can be prepared as a layered structure. This can include the steps of depositing a first seed layer solution comprising ions of A and B and subsequently forming of a dense seed sub-layer comprising a first pyrolysis procedure. This first pyrolysis procedure can be characterized by a first pyrolysis temperature T1 and a first holding time t1 at the first pyrolysis temperature T1. Further, the procedure comprises depositing a second seed layer solution comprising ions of A and B and forming of a porous seed sub-layer by a second pyrolysis procedure. The second pyrolysis procedure is characterized second pyrolysis temperature T2, and a second holding time t2 at the second pyrolysis temperature T2.

This means that a first seed layer is prepared as a layered structure and the layered structure comprises a dense seed sub-layer and a porous seed sub-layer. The dense seed sub-layer can be prepared by deposition of the first seed layer solution directly onto the main substrate surface. This means that the dense seed sub-layer is prepared directly on the main substrate surface. In this case the porous seed sub-layer can then be prepared on top of the dense seed sub-layer. Thus a dense oriented sublayer as described above is formed directly on the main substrate surface with the porous oriented sublayer on top of it. Thus an efficient buffering effect may be achieved.

However, in principle the order may also be reversed and the porous seed sub-layer can be prepared in direct contact with the main substrate surface.

Furthermore, it can be noted that typically the pyrolysis procedure is applied previous to the annealing procedure. For example, organic components, which may be present in the seed layer solutions are removed at least partially by the pyrolysis procedure. Thus an amorphous preliminary seed sublayer can be formed. During annealing the material can crystalized and a crystalline seed sub-layer can be formed.

As a further aspect of the process of forming a piezoelectric assembly the following relations can be defined: T2 is smaller than T1 and/or t2 is smaller than t1.

In a case, in which the second pyrolysis temperature T2 is lower than the first pyrolysis temperature T1, organic components which can be typically present in the second seed layer solution tend to not fully decompose and dissipate completely from the forming layer. Thus partial solid, but mainly gaseous remains may cause the porous seed sub-layer to have a higher porosity than the dense seed sub-layer.

A shorter pyrolysis holding time t2 than t1 can have a similar effect. Only brief flashing for a holding time t2 at the second pyrolysis temperature T2 results in a less efficient dissipation and removal of remainders and decomposition products of organic components at a comparatively longer first holding time t1.

In the case of t2<t1, T1 and T2 may be the same, which may support a less elaborate process management as in a case in which T1 and T2 are set to different values.

If both T2<T1 and t2<t1, the effects may add and the porosity of the porous seed sub-layer may be increased, compared to the dense seed sub-layer.

Both the dense and the porous seed sub-layer can be formed by repeated deposition, drying, pyrolysis and annealing cycles, in order to reach a desired thickness of a sub-layer or of the entire first seed layer.

In a further embodiment of the process of forming a piezoelectric assembly, the second seed layer solution can comprise a polymer. Further, the second pyrolysis procedure may be carried out such that the polymer is not decomposed and dissipated completely.

Typically, a polymer can be regarded as an organic component, which is more difficult to decompose than other smaller organic molecules typically present in a seed layer solution.

This approach allows formation of a porous seed sub-layer, even if the first pyrolysis procedure and the second annealing procedure are identical.

Two effects may be responsible for the formation of pores, when forming a porous seed sub-layer from a polymer containing second seed layer solution. First the polymer pre-occupies space, which may become a pore after pyrolysis and annealing. Second, and likely more relevant, gaseous decomposition products can be formed from the polymer during the second annealing procedure, which become entrapped in the forming porous seed sub-layer, and thus pores can be formed.

Typically, using a polymer containing solution supports formation of a porous seed sub-layer with higher porosity as in a case without a polymer.

However, by additionally having T2<T1 and/or t2<t1 an even higher porosity may be achieved.

Generally, if the second pyrolysis temperature was too high and/or the second holding time was too long full decomposition and dissipation of the polymer may take place, which typically suppresses the formation of pores.

In one embodiment of the process of forming a piezoelectric assembly, at least the first seed layer solution or the piezoelectric layer solution is deposited in a spin-coating method.

Spin-coating methods are routinely applied techniques by which various substrates can be easily coated with perovskite films. They allow for tuning of the thickness of an as deposited layer or sub layer by the rotation speed. Thereby highly homogenous and highly oriented perovskite films can be formed.

In another aspect of the process of forming a piezoelectric assembly at least the first seed layer solution on the piezoelectric layer solution is deposited by a printing method, such as inkjet printing.

With printing methods allowing for high spatially definition, accurate deposition of the above described solutions is possible. Thereby structures or structured films can be produced on a largescale basis.

BRIEF DESCRIPTION OF THE DRAWINGS

In the following the invention is explained in greater detail on the basis of exemplary embodiments and the associated figures.

The figures serve solely to elucidate the invention and are therefore only illustrated schematically and not in a manner true to scale. Individual parts may be illustrated in an enlarged manner or in a distorted manner in terms of the dimensions. Therefore neither absolute nor relative dimensional specifications can be inferred from the figures. Identical or identically acting parts are provided with identical reference signs.

In the figures:

FIG. 1 shows a first exemplary embodiment of a piezoelectric assembly in schematic cross-section;

FIG. 2 shows a second exemplary embodiment of a piezoelectric assembly in schematic cross-section;

FIG. 3 shows a third exemplary embodiment of piezoelectric assembly in schematic cross-section;

FIG. 4 shows a scanning electron microscopy image of a cross-section of a part of the third exemplary embodiment of a piezoelectric assembly;

FIG. 5 shows a fourth exemplary embodiment of a piezoelectric assembly in schematic cross-section;

FIG. 6 shows the fourth exemplary embodiment of a piezoelectric assembly in schematic cross-section in a bent state;

FIG. 7 shows a fifth exemplary embodiment of a piezoelectric assembly in schematic cross-section;

FIG. 8 shows a sixth exemplary embodiment of a piezoelectric assembly in schematic cross-section;

FIG. 9 shows an x-ray diffraction pattern of a piezoelectric assembly on a 20 μm thick substrate and on a 500 μm thick substrate;

Figure 10:
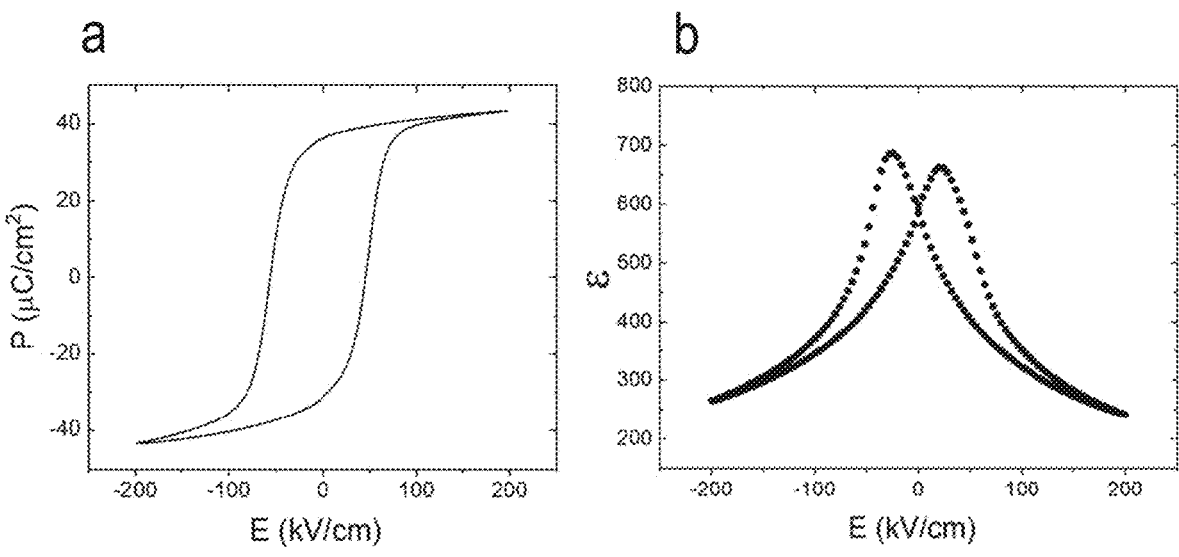
Figure 11:
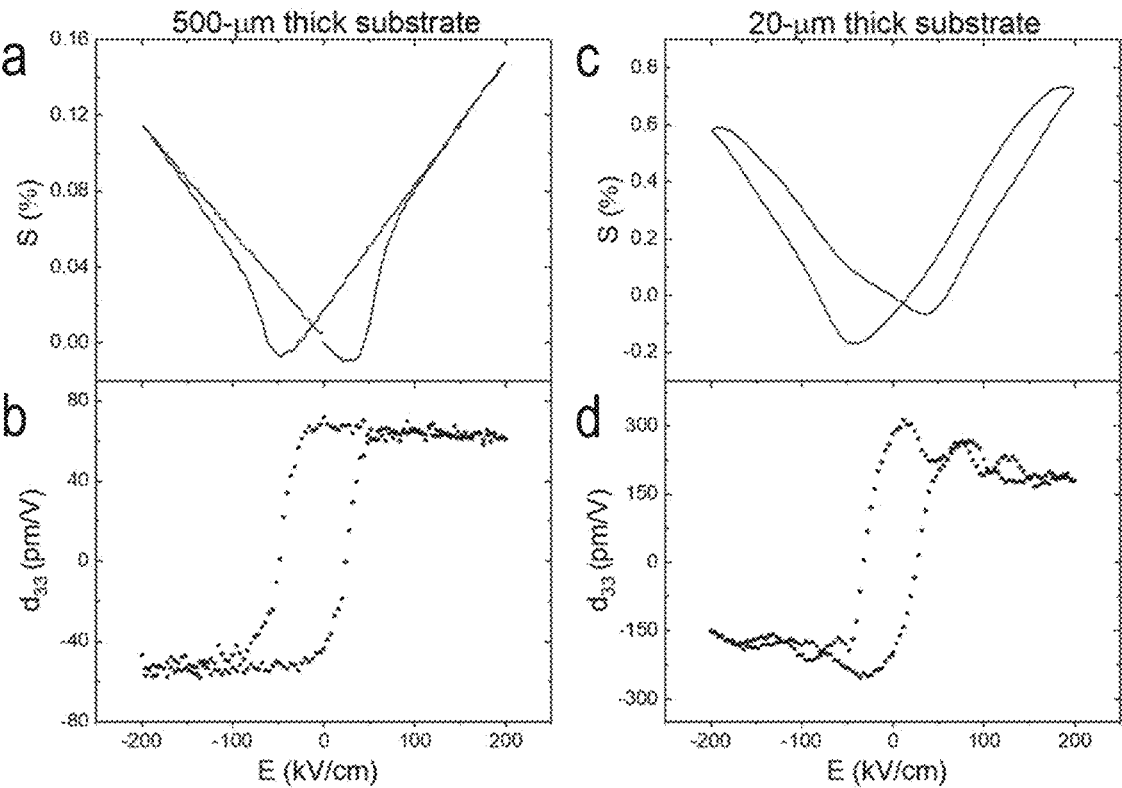

FIG. 10 shows the electric field dependence of the electrical polarization (FIG. 10A) and the real part of the dielectric permittivity at different DC bias fields (FIG. 10B) for a piezoelectric assembly with a 20 μm thick stainless steel substrate; and FIG. 11 shows the electric field dependence of the relative strain (S) for a 500 μm thick substrate (FIG. 11A) and a 20 μm thick substrate (FIG. 11C) and the longitudinal piezoelectric coefficient (d33) at different DC bias fields for a piezoelectric film on a 500 μm (FIG. 11B) and a 20 μm (FIG. 11D) thick substrate.

Figure 12:
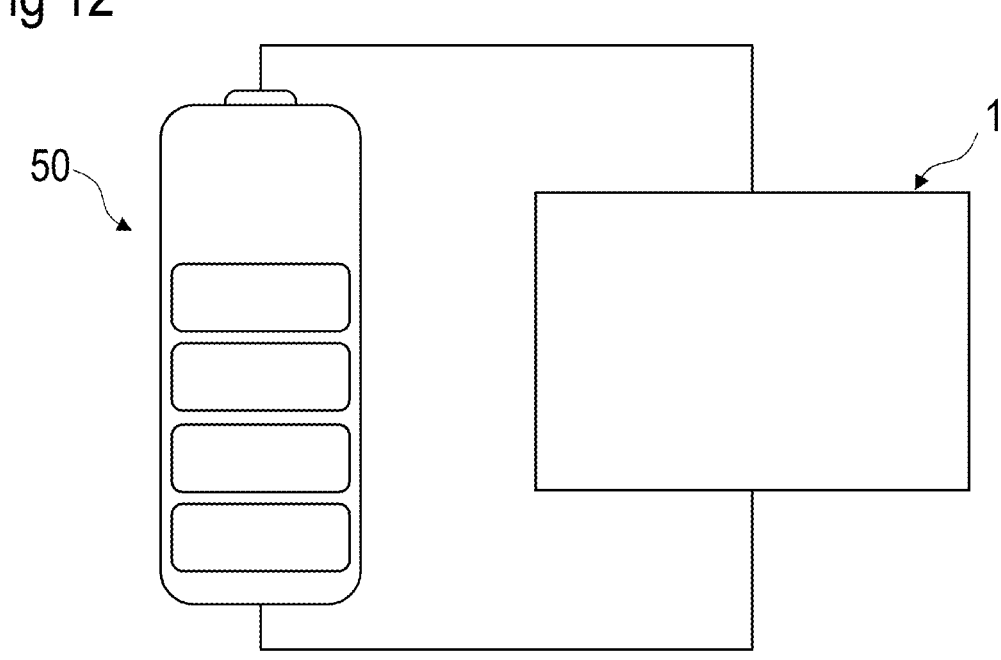

FIG. 12 shows a schematic representation of an energy storage element that comprises a piezoelectric assembly.

Figure 13:
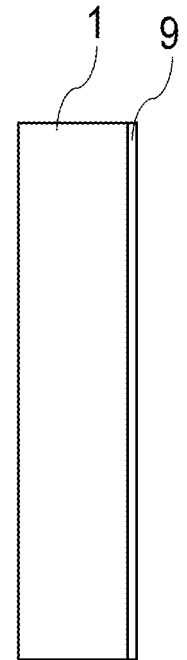

FIG. 13 shows a micromirror that comprises a piezoelectric assembly.

DETAILED DESCRIPTION OF THE DRAWINGS

Figure 1:
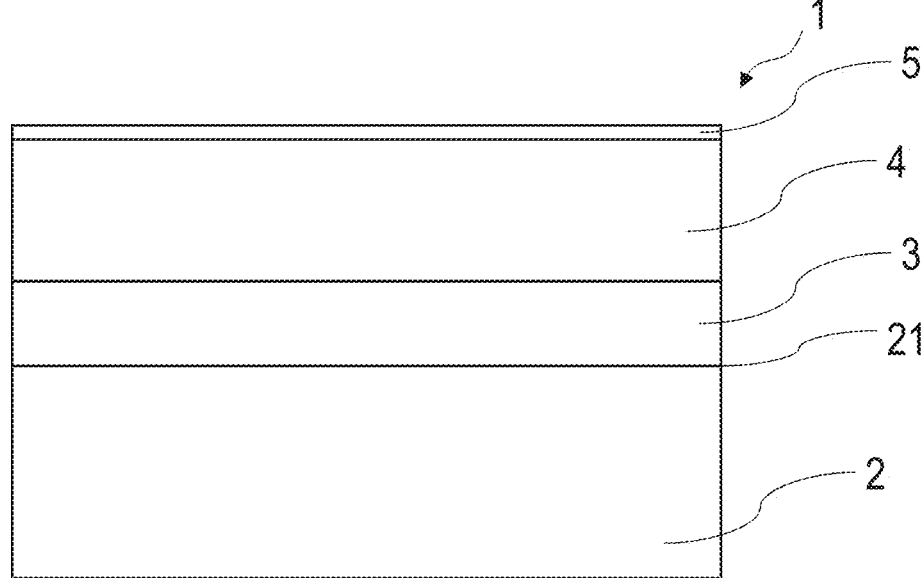

FIG. 1 shows a schematic cross-section of a first exemplary embodiment of a piezoelectric assembly 1.

The piezoelectric assembly 1 comprises a nickel-chromium-based austenitic steel substrate 2. The substrate 2 can be, for example, a steel such as EN 1.4310, EN 1.4404, EN 1.4541 or EN 1.4845. These steels have a preferential oxidation resistivity. The substrate 2 comprises a main substrate surface 21 which preferably has an arithmetical mean deviation of the surface roughness (Ra) of 200 nm or below.

A first oriented layer 3 is arranged directly on the main substrate surface 21. The first oriented layer 3 comprises lanthanum nickelate (LaNiO3) as the first material of the first oriented layer 3. The perovskite crystallites of the first material have a degree of orientation o of 90% or more, preferentially of 95% or more and most preferably of 99% or more.

As indicated in FIG. 1, the main substrate surface can be flat, therefore the direction of all local surface normals is the same.

The higher the degree of orientation of the templating first oriented layer 3, the higher can be the degree of orientation o of the first piezoelectric layer 4 assembled on the first oriented layer 3 can.

The overall thickness of the first oriented layer 3 may be in the range between 10 nm to 500 nm. For example, the thickness of the oriented layer may be in the range between 100 and 200 nm, for example 150 nm.

The first piezoelectric layer 4 consists of a piezoelectric material of crystalline perovskite structure. The piezoelectric material of this present exemplary embodiment is a lead zirconate titanate based material, for example a lanthanum-doped lead zirconate titanate, such as (La0.02Pb0.98)(Zr0.52Ti0.48)O3.

The piezoelectric material of the first piezoelectric layer 4 has a degree or orientation o of 90% or more. Even more preferably, the degree or orientation o of the piezoelectric material of the first piezoelectric layer 4 is 95% or more, or better 99% or more.

The higher the degree or orientation o the higher the values for the longitudinal piezoelectric coefficient d33 of the overall layer can be. Values for d33 of up to 300 pm/V can be achieved with a degree or orientation o in the range of 99%.

The thickness of the first piezoelectric layer may be between 100 nm and 5 μm, for example the thickness can be in the range between 600 and 900 nm.

A top electrode 5 is arranged on top of the first piezoelectric layer. The top electrode 5 may consist of any suitable conductive material, for example it can consist of a metal or of a conductive oxide or ceramic material. For example, the top electrode may consist of copper, nickel, gold, silver, platinum, or lanthanum nickelate, or be a layered electrode such as Cr/Ni/Ag, Cr/Ni/Au, Ni/Au, Cr/Au or Ti/Au.

The substrate 2 together with the conducting first oriented layer 3 can act as a base electrode, when electrically contacted externally.

The first exemplary embodiment of a piezoelectric assembly 1 can be produced by any suitable process. It can be produced, for example, by the following process.

First, the austenitic steel substrate 2 is provided. The main substrate surface 21 is cleaned by an ultrasonic cleaning method in acetone, isopropanol and deionized water. It is dried in a flow of nitrogen. Subsequently it is treated under UV and ozone to remove organic components. Other cleaning methods may be applied. It is important to achieve a nearly atomically clean surface, which shows suitable wettability by the seed-layer solution.

On the main substrate surface 21, then the first seed layer 3 is prepared, for example by a spin-coating method or a screen-printing method. In the fully processed assembly the resulting layer can be identified as the first oriented layer 3.

The first seed layer 3 can be formed by a repeated deposition, drying, pyrolysis and annealing procedure.

For example a seed layer of 150 nm thickness can be prepared as follows: First lanthanum acetate and nickel nitrate is dissolved in 2-ethoxyethanol forming a solution of 0.5 mol/l concerning La- and Ni-ions. The mixture is heated for 2 h at 80° C. under reflux yielding a clear solution. After cooling back to room temperature a first seed layer solution with a concentration of 0.2 mol/l is formed by adding solvent.

To prepare a first seed layer 3 with a thickness of approximately 150 nm a six times repeated spin-coating deposition, drying, pyrolysis and annealing procedure can be performed. One preparation cycle comprises: Deposition of the first seed layer solution on the main substrate surface 21 in a spin-coating process with a rotation speed of 3000 rpm for 30 s. Subsequently, the solvent is removed by drying at around 100° C. to 200° C. Subsequently a pyrolysis step (first pyrolysis procedure) is performed to remove other organic components at the first pyrolysis temperature of 300° C. to 450° C. A first holding time at the first pyrolysis temperature may be in the range of 0.1 min to 10 min, typically of 0.5 min to 5 min. Thereby an amorphous preliminary seed sublayer is formed. Subsequently, the film is annealed at a temperature of 600 to 750° C. to crystalize it. The first temperature increase rate is typically 10 K/s or above, such as for example 30 K/s, preferably, as it facilitates growth of the first seed layer in 100 crystal orientation. The annealing can be performed in a nitrogen oxygen mixture with a nitrogen-to-oxygen ratio of 4:1, to ensure a stoichiometric oxygen content in the seed layer.

By adapting the number of deposition cycles, the thickness of the first seed layer 3 can be varied.

On the as prepared, highly oriented seed layer 3, an also highly oriented first piezoelectric layer 4 can be prepared.

The preparation of the first piezoelectric layer 4 is in principle very similar to the preparation of the first seed layer 3. It also can be based on a repeated deposition of a piezoelectric layer solution, drying, pyrolysis and annealing procedure.

The piezoelectric layer solution can be prepared by: First a solution is prepared comprising the ions of the lead zirconate titanate piezoelectric material. For example, for a piezoelectric material of the composition (La0.02Pb0.98) (Zr0.52Ti0.48)O3 a solution of zirconium n-propoxide (0.52 mol/l), titanium isopropoxide (0.48 mol/l), anhydrous lead acetate (1.127 mol/l), and anhydrous lanthanum acetate (0.02 mol/l) is prepared in 2-methoxyethanol. In this solution the lead is present in a 15% molar excess in relation to the desired stoichiometric ratio in the piezoelectric material, to compensate the lead-losses during heating steps in the preparation procedure. A clear solution was produced by heating to around 120° C. for 2 h under reflux and after distillation. A piezoelectric layer solution of 0.5 mol/l in terms of (La0.02Pb0.98)(Zr0.52Ti0.48)O3 with 15% molar excess of lead is prepared by adding of solvent.

The piezoelectric layer can be produced in a repeated deposition, drying, pyrolysis and annealing procedure. For example for a layer thickness in the order of 780 nm the following scheme can be applied: First, the piezoelectric layer solution is deposited in a spin-coating process with a rotation speed of 3000 rpm applied for 30 s. Subsequently, the deposited solution is dried at temperatures between 100 and 200° C. Then a pyrolysis step is applied at temperatures between 300 to 450° C. to remove organic components. This produces an amorphous preliminary piezoelectric sub layer. The procedure up to this point can be repeated up to three times. This means that three amorphous partial layers can be assembled one upon another. Subsequently an annealing procedure at 500 to 700° C. in a nitrogen oxygen mixture with a nitrogen-to-oxygen ratio of 4:1 is performed for an annealing time below 15 minutes. For example the annealing time can be 1 to 5 minutes. This procedure may be repeated four times, which means that the overall first piezoelectric layer of 780 nm is formed from 12 preliminary sub-layers.

By adapting the number of deposition cycles, the thickness of the first piezoelectric layer 4 can be varied.

The outer electrode 5 can be deposited by any suitable technique, for example sputtering or a burn-in procedure may be applied.

Figure 2:
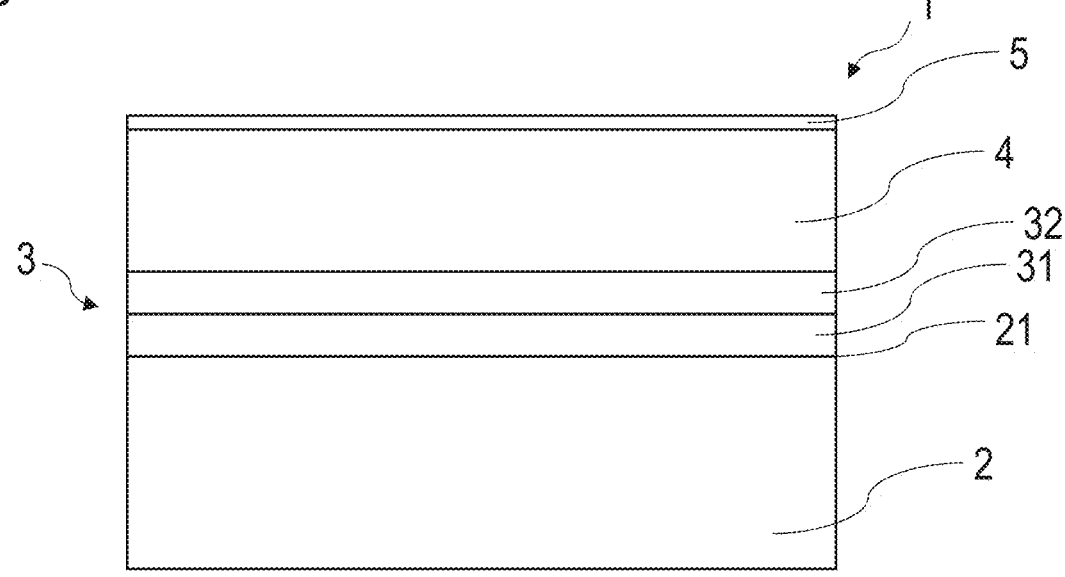

FIG. 2 shows a schematic cross-section of a second exemplary embodiment of the piezoelectric assembly 1.

The second exemplary embodiment can be identical to the first exemplary embodiment except for the first oriented layer 3, which has a layered structure.

The first oriented layer 3 consists of a dense oriented sub-layer 31 and a porous oriented sub-layer 32. Both consist of the same first material as the first oriented layer 3 in the first exemplary embodiment.

However, the dense oriented sub-layer 31 has an at least two times higher density, or in other words a two times lower porosity than the porous oriented sub-layer 32.

The porous oriented sub-layer 32 consists of a porous material with average pore diameters below 100 nm and preferentially in the range between 1 nm to 20 nm.

This assembly has the advantage that the dense oriented sub-layer 31 assembled directly on the austenitic steel substrate 2 can be an efficient buffer layer, which prevents interdiffusion between the first piezoelectric layer 4 and the substrate 2.

The porous oriented sub-layer 32 can provide stress relaxation between the substrate 2 and the first piezoelectric layer 4. Thereby, the substrate clamping effect can be reduced.

In such an assembly the relative strain S of the piezoelectric material can exceed 0.7%. This is a value comparable to piezoelectric thin-films achieved on expensive silicon wafer substrates.

The preparation procedure for the second exemplary embodiment can be identical to the procedure for the first exemplary embodiment, however with adaptions for the first seed layer 3.

Typically a dense seed sub-layer 31 can be prepared by the deposition, drying, pyrolysis and annealing procedure described for the preparation of the entire first seed layer 3 of the first exemplary embodiment. This procedure can be repeated, for example, three times.

For a porous seed sub-layer 32 two principal preparation techniques can be applied. In the first option, first a second seed layer solution is prepared identically to the first seed layer solution, except for a lower concentration in the range of 0.1 to 0.15 mol/l concerning Ni- and La-ions. The deposition, drying and annealing can be identical to the dense seed sub-layer 31 preparation. For the porous seed sub-layer 32, a second pyrolysis procedure is applied. The second pyrolysis procedure is characterized by a second pyrolysis temperature T2 and a second holding time t2. To cause a porosity of the porous seed sub-layer 32 to be higher than the porosity of the dense seed sub layer 31 either the second pyrolysis temperature T2 must be smaller than the first pyrolysis temperature or the second holding time t2 is chosen shorter than the first holding time. For example in a case in, which T1=T2, t2 may be below 2 min, for example 0.5 min, and t1 may be higher than 2 min, for example 5 min.

This procedure can be repeated to achieve a desired thickness of the porous seed sub-layer 32.

A second option for producing the porous seed sub-layer 32 based on the use of a polymer. The polymer can be added to the above-described second seed-layer solution. The polymer may be, for example, polyvinlypyrrolidone which may be added in an amount of 1 g/5 ml. The solution as prepared may be stirred for 24 hours and be filtered by a 0.2 μm filter. In principle other polymers, such as polymethyl-methacrylate or polyethylene glycol can also be used, depending for example on the solubility in the solvent and the conditions of the pyrolysis step.

The porous seed sub-layer 32 can be formed using the second seed sublayer solution containing the polymer similarly to the first sublayer solution. However, the temperature of the pyrolysis step has to be chosen such that the polymer is not decomposed and dissipated completely. The residues of the polymer remain in the formed amorphous porous seed sub-layer. These residues prevent formation of a closed and dense seed sub-layer. Only during the third annealing procedure the polymer is fully dissociated and dissipated. At these temperatures the perovskite material can be crystalized efficiently. However, hardly any sintering takes place under these conditions.

In the completed piezoelectric assembly, the dense seed sub-layer 31 can be identified as the dense oriented sublayer 31 and the porous seed sub-layer 32 can be identified as the porous oriented sublayer 32.

Figure 3:
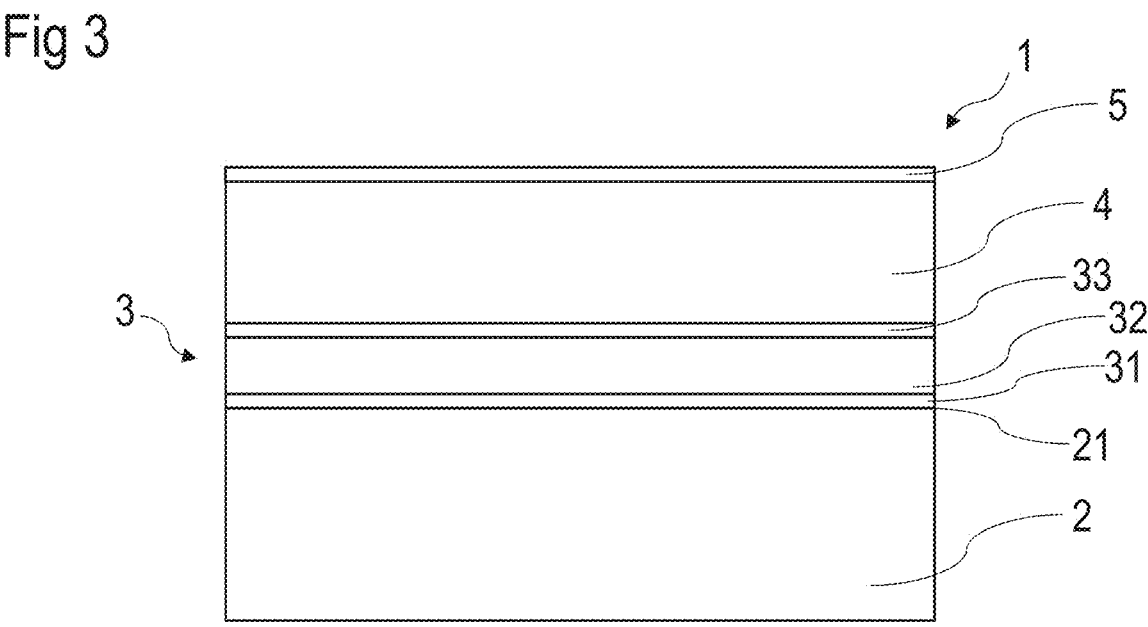

FIG. 3 shows a third exemplary embodiment of a piezoelectric assembly 1. It is identical to the first exemplary embodiment of the piezoelectric assembly except for the first oriented layer 3.

The first oriented layer 3 comprises a dense oriented sub-layer 31 directly attached to the main substrate surface 21. It comprises a porous oriented sub-layer 32 directly above the dense oriented sub-layer 31. Further, it comprises a further dense oriented sub-layer 33 which is directly arranged on the porous oriented sub-layer 32. The preparation procedure of the porous and dense oriented sub-layers can be performed analogously as described for the second exemplary embodiment shown in FIG. 2.

Preferably the dense oriented sub-layers 31 and 33 are thinner than the porous oriented sub-layer 32. Thereby a chemical buffering can be achieved by the lower dense oriented sub-layer 31. Further a smooth continuous surface is formed by the upper dense oriented sub-layer 33 on which high quality piezoelectric films can be formed. Further, the comparatively thick porous oriented sub-layer 32 allows for an efficient stress release between the substrate 2 and the first piezoelectric layer 4. For example a thickness ratio between the lower dense oriented sub-layer 31, the porous oriented sub-layer 32 and the upper dense oriented sub-layer 33 may be 1:4:1. For example, an overall thickness may be 150 nm.

Figure 4:
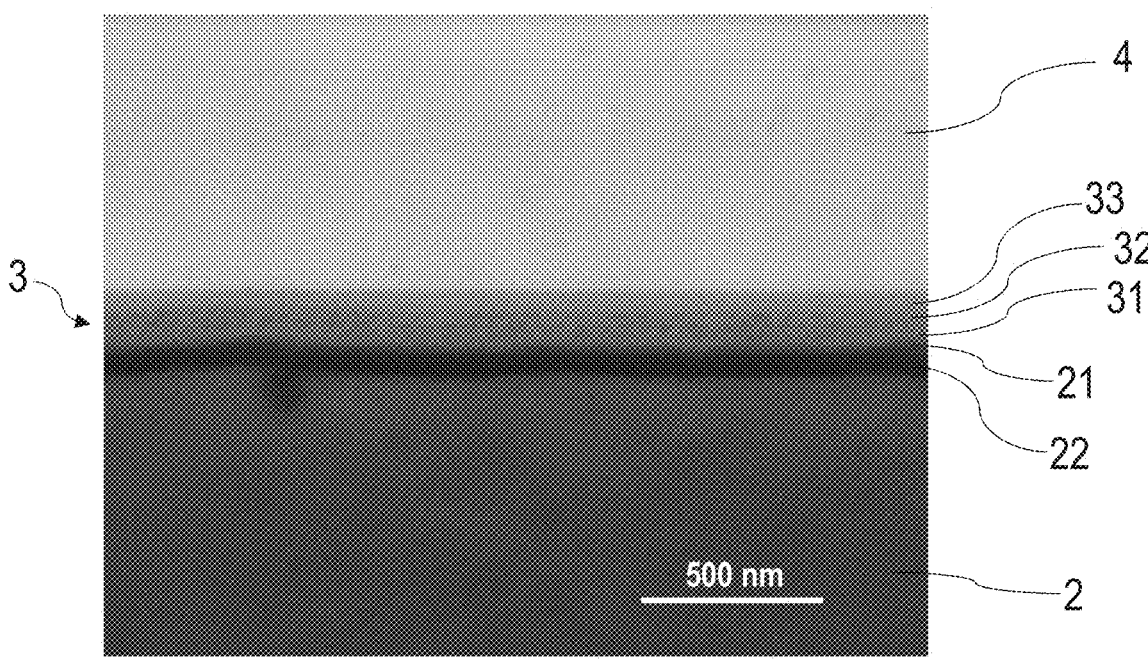

FIG. 4 shows a cross-sectional scanning electron microscopy (SEM) image of the piezoelectric assembly 1 as shown in FIG. 3, except for the outer electrode 5, which is not present in the sample of the SEM image.

In the SEM image in FIG. 4 the layers of the piezoelectric assembly 1 can be clearly identified and are labelled accordingly. Interestingly a chromium-enriched layer 22 has formed in the vicinity of the main substrate surface 21 and is visible as a darkened layer in the piezoelectric assembly 1. It is believed that the chromium enrichment takes place during pyrolysis or annealing procedures. By Energy-dispersive X-ray spectroscopy (EDX) the absence of Cr or other elements form the substrate in the first piezoelectric layer was proven. Thus EDX could prove that the first oriented layer provides can exhibit an efficient buffering function.

Figures 5, 6:
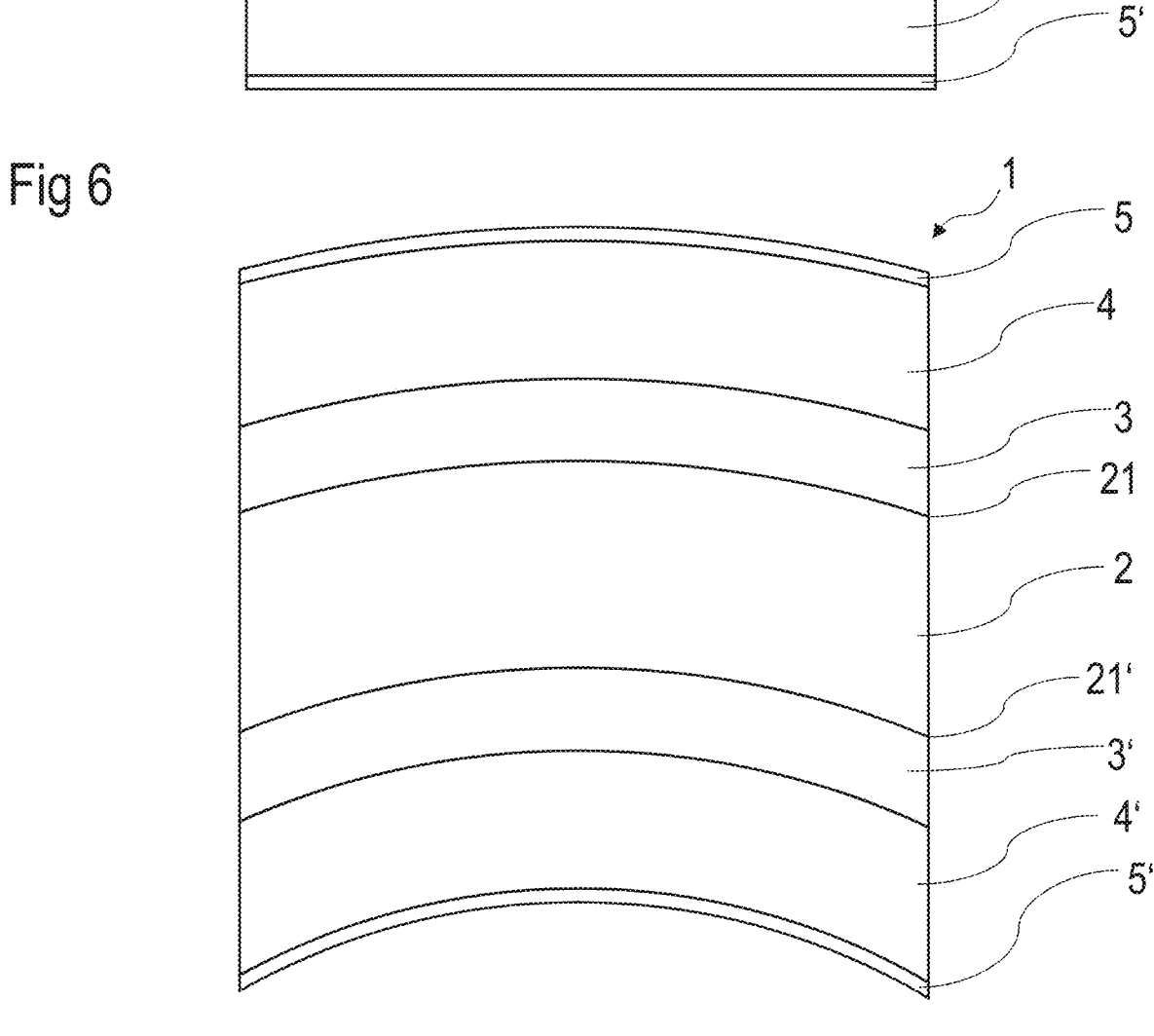

FIG. 5 shows a schematic cross-section of a fourth exemplary embodiment of a piezoelectric assembly 1.

The layers assembled above the main substrate surface 21 of the substrate 2 can be identical to the first exemplary embodiment shown in FIG. 1. Further, in principle the oriented layer 3 can be realized also in analogy to the second or third exemplary embodiment.

In this fourth exemplary embodiment the substrate 2 comprises a second substrate surface 21' opposite to the main substrate surface 21. On the second substrate surface 21' an oriented layer 3' which can be identical to the first oriented layer 3 is assembled. Further a piezoelectric layer 4' which may be identical to the first piezoelectric layer 4 is assembled on the oriented layer 3'. Further, a second outer electrode 5' is assembled on the piezoelectric layer 4'.

This means that a symmetrical stacking on the main substrate surface 21 and on the second substrate surface 21' is realized.

In this arrangement the substrate 2 and the oriented layers 3 and 3' can form an internal electrode.

The preparation procedure can be analogous to the preparation procedure discussed for the first exemplary embodiment shown in FIG. 1.

FIG. 6 shows the fourth exemplary embodiment of a piezoelectric assembly in a bent state. It can be realized on a bent substrate or it can be arranged in an application in which it becomes bent. This means that the symmetry described for the embodiment shown in FIG. 5 is maintained only along the local surface normal of the main substrate surface, which means for each point along the direction of the local surface normal each layer is a mirror equivalent on both sides of the substrate 2.

Figure 7:
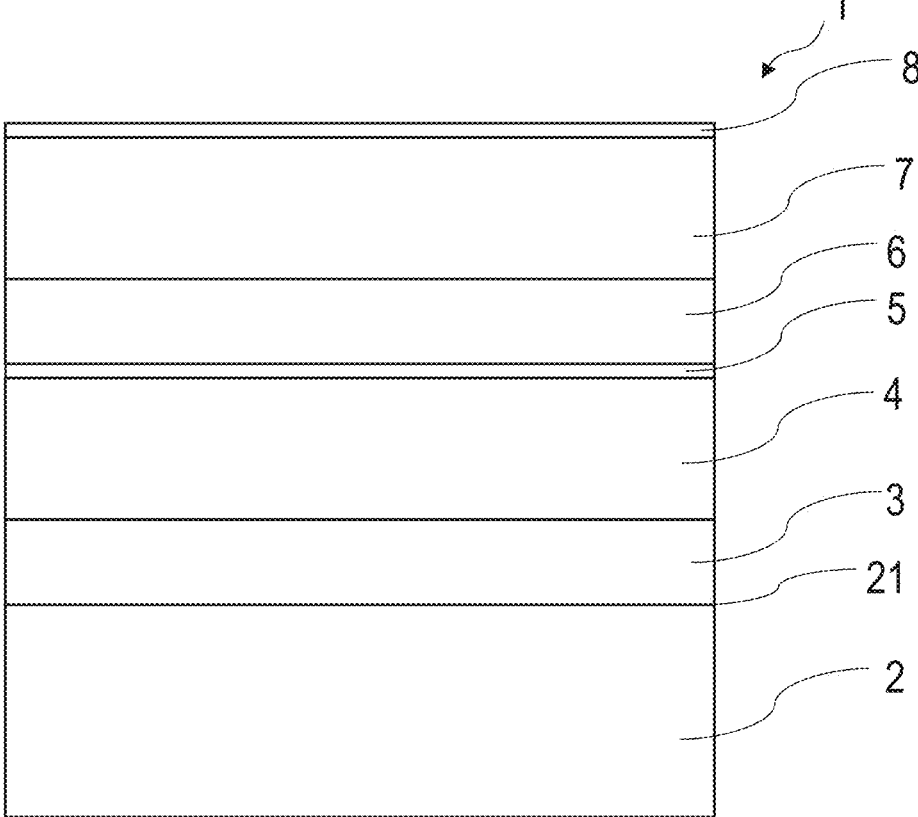

FIG. 7 shows a fifth exemplary embodiment of a piezoelectric assembly in schematic cross-section.

It is based on the first exemplary embodiment of a piezoelectric assembly as shown in FIG. 1. However, on the electrode 5, which was the outer electrode 5 in the first exemplary embodiment, further layers are arranged.

A second oriented layer 6 is arranged directly on the electrode 5, which thus becomes an internal electrode. In principle the second oriented layer 6 can be identical to the first oriented layer 3. On the second oriented layer 6 a second piezoelectric layer 7 is arranged which may be identical to the first piezoelectric layer 4. This means in particular the composition and the degree of orientation o of the second oriented layer 6 and the second piezoelectric layer 7 may be identical to the first oriented layer 3 and the first piezoelectric layer 4, respectively. An outer electrode 8 is arranged on the second piezoelectric layer 7.

The preparation procedure can be analogous to the preparation procedure discussed for the first exemplary embodiment shown in FIG. 1.

In such an assembly the substrate 2 with the first oriented layer 3 can serve as a base electrode. The electrode 5 together with the second oriented layer 6 can serve as an internal electrode.

Figure 8:
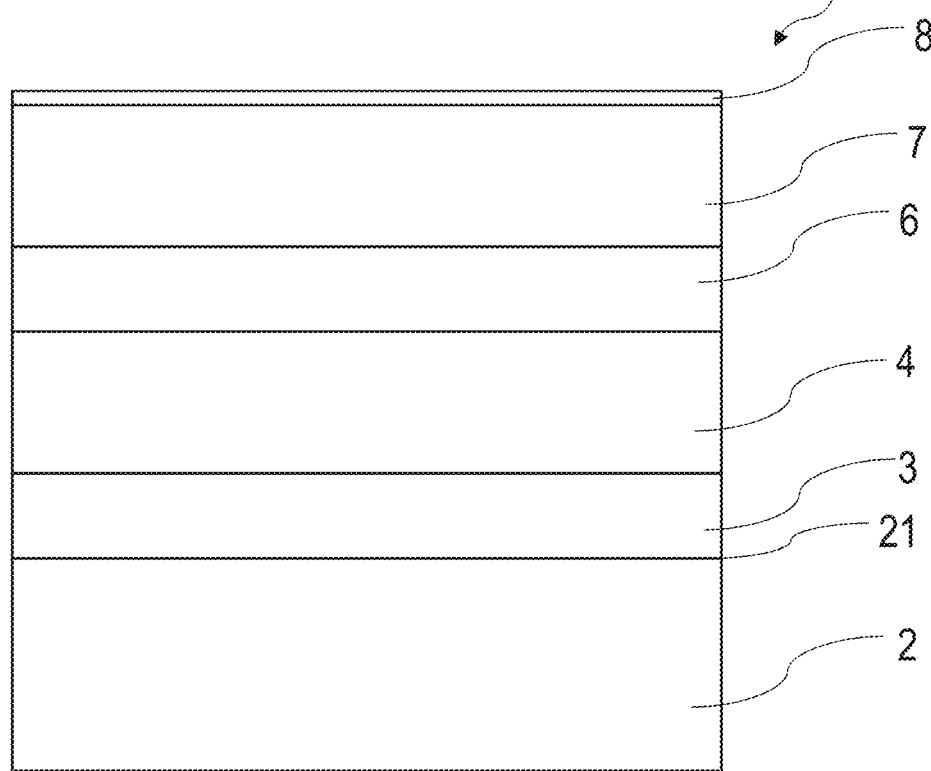

FIG. 8 shows a sixth exemplary embodiment of a piezoelectric assembly 1. It is identical to the fifth exemplary embodiment of a piezoelectric assembly shown in FIG. 7, except for the internal electrode 5, which is not present in the sixth exemplary embodiment. Instead, the second oriented layer 6 is arranged directly on the first piezoelectric layer 4.

In such an arrangement the second oriented layer 6 can act as an internal electrode, when electrically contacted.

Figure 9:
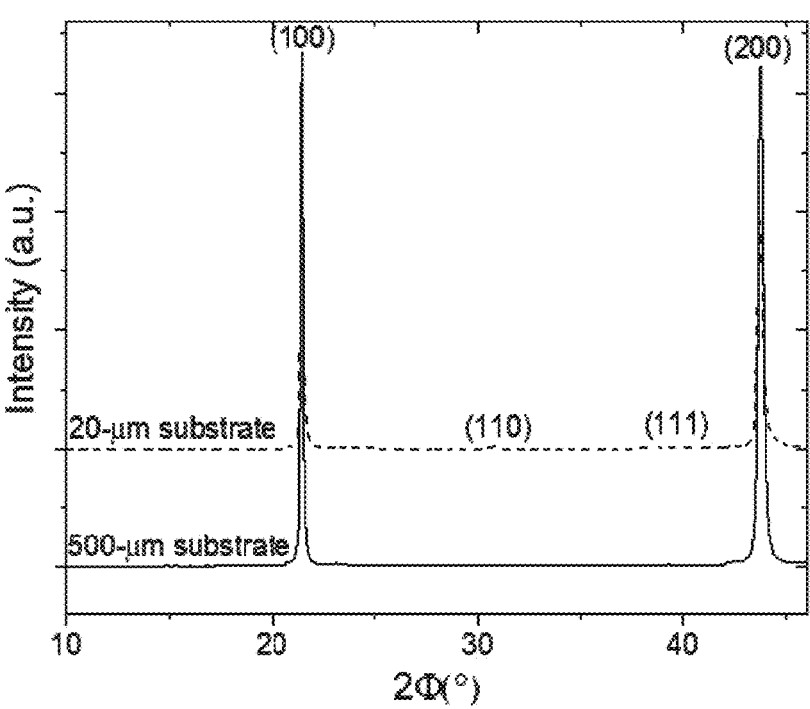

FIG. 9 shows an X-ray diffraction patterns of the piezoelectric layer assemblies similar to the one shown in FIG. 4. Both samples comprise a nickel-chromium-based austenitic steel substrate, one with a thickness of 20 μm and a second with a thickness of 500 μm.

The intensities for the (100) and (200) diffraction peaks for both samples are compared to the intensity of the (110) and (111) peaks and are evaluated in terms of a Lotgering factor (LF100), which has found to be above 99% for both samples. This is equivalent to a degree of orientation o of the crystalline perovskite structure of the first piezoelectric layer of 99% or above.

This proves that highly oriented piezoelectric films can be prepared with the above-described procedure.

FIG. 10 provides an analysis of the electric properties of the assembly discussed for FIG. 9 with the 20 μm thick substrate. For the measurements a sputtered gold electrode 5 with a diameter of 500 μm was formed on the first piezoelectric layer 3.

The measurements were carried out with a Aixacct TF2000FE using a sinusoidal test signal of 100 Hz.

FIG. 10A shows the electric field dependence of the electrical polarization at different DC bias fields.

A typical ferroelectric square-like hysteresis loop is observed in the polarization electric field measurements, with a saturation polarization being over 40 μC/cm2. A coercive field of 50 kV/cm is observed.

FIG. 10B shows the dependence of the real part of the dielectric permittivity on the DC bias field.

The real part of the complex dielectric permittivity at 0 DC fields approaches 600 and it approaches 700 at the coercive field.

These values are considerably larger than values reported previously for piezoelectric thin-films prepared on metal foils, for example compared to the film of EP 1 282 901 B1 where around only a dielectric permittivity of 150 was measured. This shows that superior piezoelectric assemblies can be formed with the above-described methods.

FIG. 11 shows the results of double-beam laser interferometry measurements recorded with a frequency of 1 kHz on both samples addressed in the context of FIG. 9. Both the 20 μm and the 500 μm substrate sample have a gold electrode with a diameter of 500 μm arranged on the first piezoelectric layer.

FIG. 11A shows the electric field dependence of the relative strain (S) for the piezoelectric assembly with a 500 μm thick substrate. FIG. 11B shows the, longitudinal piezoelectric coefficient d33 in dependence on the electric field for the piezoelectric assembly on a 500 μm thick substrate.

The equivalent curves for the sample with the 20 μm thick substrate are shown in FIGS. 11C and 11D, respectively.

Relative strain (S) can be understood as the relative displacement, perpendicular to the film normal and induced by an electric field in the piezoelectric assembly. S was measured with a sinusoidal test signal at 100 Hz. The longitudinal piezoelectric coefficient d33 was extracted from field-induced displacement measurements using an AC signal of 0.5 V at 1 KHz.

For the assembly with a 500 μm thick substrate an S value of 0.15% is exceeded. This equals a peak value for the longitudinal piezoelectric coefficient d33 of above 70 pm/V.

For the assembly on the 20 μm thick substrate even higher values are achieved. A relative strain S of 0.7% is exceeded. This equals a d33 value of 300 pm/V, approximately.

Note that the undulating signal measured for the hysteresis curve of FIG. 11D towards low or high electric field, may be caused by minor deviations in the thickness of the substrate, which affect the measurements accordingly during piezoelectric bending of the substrate These values are to the best of the author's knowledge the highest reported for piezoelectric thin-films on steel substrate. In this context compare, for example, non-patent literature 2. The achieved values are even comparable to piezoelectric thin-film elements prepared on standard silicon wafer substrates comprising noble electrode materials. In this context compare, for example, non-patent literature 1.

FIG. 12 shows a schematic representation of an energy storage element 50. It comprises a piezoelectric assembly 1, which may be any of the aforementioned piezoelectric assemblies 1. The piezoelectric assembly 1 is configured to harvest electrical energy during mechanical deformation of the piezoelectric assembly 1 which is then stored as an electrical energy by the energy storage element 50.

FIG. 13 shows a micromirror comprising the piezoelectric assembly 1. The piezoelectric assembly 1 can be a piezoelectric assembly according to any of the above-mentioned embodiments. The micromirror comprises a mirror surface 9 which is attached to the piezoelectric assembly 1. Alternatively, the mirror surface 9 may be a surface of the piezoelectric assembly that is prepared reflectively. In both cases the piezoelectric assembly is configured to bend the micromirror upon voltage application to the piezoelectric assembly.

REFERENCE LIST 1 piezoelectric assembly
2 substrate
21 main substrate surface

21' second substrate surface
3 first oriented layer
3' oriented layer
31 dense oriented sub-layer
32 porous oriented sub-layer
33 dense oriented sub-layer
4 first piezoelectric layer
4' piezoelectric layer
5 electrode
5' electrode
50 energy storage element
6 second oriented layer
7 second piezoelectric layer
8 electrode
9 mirror surface

The invention claimed is:

1. A piezoelectric assembly comprising
a base metal substrate having a main substrate surface;
a first oriented layer arranged on the main substrate surface, the first oriented layer comprising a first material of crystalline perovskite structure which constitutes at least 90 wt % of the first oriented layer; and
a first piezoelectric layer arranged on the first oriented layer, the first piezoelectric layer comprises a piezoelectric material of crystalline perovskite structure comprising lead, the piezoelectric material having a larger longitudinal piezoelectric coefficient ($d_{33}$) along a direction of unit cells of the piezoelectric material than the first material of the first oriented layer, and wherein a degree of orientation "o" of the piezoelectric material of the first piezoelectric layer is 90% or more, wherein the degree of orientation "o" is the average degree of alignment of the direction of the unit cells of the piezoelectric material with a local surface normal "N" of the main substrate surface,
wherein the first oriented layer comprises a porous oriented sub-layer which has a porous structure with a relative porosity of up to 70%,
wherein the first oriented layer further comprises a dense oriented sub-layer, the porous oriented sub-layer having a concentration of pores at least two times higher than a concentration of pores of the dense oriented sub-layer, and
wherein the dense oriented sub-layer is arranged directly on the main substrate surface and the porous oriented sub-layer is arranged on the dense oriented sub-layer.

2. The piezoelectric assembly according to claim 1, wherein
the substrate has a second substrate surface opposite to the main substrate surface, and
a layered structure comprising a piezoelectric layer on an oriented layer is arranged on the second substrate surface in analogy to the first piezoelectric layer on the first oriented layer on the main substrate surface.

3. The piezoelectric assembly according to claim 1, wherein
a second oriented layer consisting of the first material is arranged above the first piezoelectric layer,
a second piezoelectric layer is arranged on the second oriented layer, wherein
the second piezoelectric layer comprises the same piezoelectric material with the same degree of orientation "o" of 90% or more as the first piezoelectric layer.

4. The piezoelectric assembly according to claim 1, wherein a further dense oriented sub-layer is arranged on the porous oriented sub-layer.

5. The piezoelectric assembly according to claim 1, wherein an average pore size of the porous oriented sub-layer is 100 nm or below.

6. The piezoelectric assembly according to claim 1, wherein the first material of the first oriented layer is selected from the group consisting of $LaNiO_3$, $SrRuO_3$, and $PbTiO_3$.

7. The piezoelectric assembly according to claim 1, wherein the first material of the first oriented layer has at least the same degree of orientation "o" of 90% or more as the crystalline perovskite structure of the first piezoelectric layer.

8. The piezoelectric assembly according to claim 1, wherein the first oriented layer has a thickness of 10 nm to 500 nm.

9. The piezoelectric assembly according to claim 1, wherein the substrate is titanium (Ti), aluminium (Al), nickel (Ni), copper (Cu), or a steel.

10. The piezoelectric assembly according to claim 1, wherein the piezoelectric material is represented by the formula $[Pb_{1-y}S^1_y][(Zr_xTi_{1-x})_{1-z}S^2_z]O_3$, wherein $S^1$ is a first substituent, $S^2$ is a second substituent, $0.40 \leq x \leq 0.95$, $y < 0.3$, and $z < 0.15$.

11. The piezoelectric assembly according to claim 1, wherein the first piezoelectric layer has a thickness of 0.1 μm to 5 μm.

12. A device comprising the piezoelectric assembly according to claim 1, wherein the piezoelectric assembly is attached to a surface of the device and configured to generate a haptic signal at the surface.

13. A device comprising the piezoelectric assembly according to claim 1 and an energy storage element, wherein the piezoelectric assembly is configured to harvest electrical energy that is generated in the piezoelectric assembly during a mechanical deformation of the piezoelectric assembly, and wherein the energy storage element is configured to store the electrical energy harvested by the piezoelectric assembly.

14. A micromirror comprising the piezoelectric assembly according to claim 1, wherein the micromirror comprises a mirror surface on a piezoelectric assembly, and the piezoelectric assembly is configured to bend the micromirror upon voltage application to the piezoelectric assembly.

15. A process of forming a piezoelectric assembly, comprising:

providing a base metal substrate having a main substrate surface;

forming a first seed layer comprising a first material of crystalline perovskite structure represented by the general formula $ABO_3$ on the main substrate surface, the forming comprising the acts of depositing a first seed layer solution comprising ions of A and B on the main substrate surface, wherein the first seed layer is prepared as a layered structure including the acts of depositing a first seed layer solution comprising ions of A and B, forming a dense seed sub-layer comprising a first pyrolysis procedure, characterized by a first pyrolysis temperature T1 and a first holding time t1 at the first pyrolysis temperature T1, depositing a second seed layer solution comprising ions of A and B, forming a porous seed sub-layer comprising a second pyrolysis procedure, characterized by a second pyrolysis temperature T2, and a second holding time t2 at the second pyrolysis temperature T2, and crystallization of the perovskite structure by a first annealing procedure, forming a first piezoelectric layer comprising a piezoelectric material of crystalline perovskite structure comprising lead, and comprising the acts of depositing a piezoelectric layer solution comprising lead-ions and further ions of the piezoelectric material, and crystallization of the perovskite structure comprising lead by a second annealing procedure.

16. The process of forming the piezoelectric assembly according to claim 15, wherein the dense seed sub-layer is prepared directly on the main substrate surface and the porous seed sub-layer is prepared on top of the dense seed sub-layer.

17. The process of forming the piezoelectric assembly according to claim 15, wherein $T_2 < T_1$, and/or $t_2 < t_1$.

18. The process of forming the piezoelectric assembly according to claim 15, wherein the second seed layer solution comprises a polymer, and the second pyrolysis procedure is carried out such that the polymer is not decomposed and dissipated completely.

19. The process of forming the piezoelectric assembly according to claim 15, wherein at least the first seed layer solution or the piezoelectric layer solution is deposited in a spin-coating method.

20. The process of forming the piezoelectric assembly according to claim 15, wherein at least the first seed layer solution or the piezoelectric layer solution is deposited by a printing method.

21. A piezoelectric assembly, comprising:

a base metal substrate having a main substrate surface;

a first oriented layer arranged on the main substrate surface, the first oriented layer comprises a first material of crystalline perovskite structure which constitutes at least 90 wt % of the first oriented layer; and a first piezoelectric layer is arranged on the first oriented layer, the first piezoelectric layer comprises a piezoelectric material of crystalline perovskite structure comprising lead, the piezoelectric material has a larger longitudinal piezoelectric coefficient (d33) along a direction of the unit cells of the piezoelectric material than the first material of the first oriented layer, and wherein a degree of orientation "o" of the piezoelectric material of the first piezoelectric layer is 90% or more, the degree of orientation "o" is the average degree of alignment of the direction of the unit cells of the crystalline piezoelectric material with a local surface normal "N" of the main substrate surface, wherein the substrate has a second substrate surface opposite to the main substrate surface, and wherein a layered structure comprising a second piezoelectric layer on a second oriented layer is arranged on the second substrate surface in analogy to the first piezoelectric layer on the first oriented layer on the main substrate surface, wherein the first oriented layer comprises a porous oriented sub-layer which has a porous structure with a relative porosity of up to 70%, wherein the first oriented layer further comprises a dense oriented sub-layer, the porous oriented sub-layer having a concentration of pores at least two times higher than a concentration of pores of the dense oriented sub-layer, and wherein the dense oriented sub-layer is arranged directly on the main substrate surface and the porous oriented sub-layer is arranged on the dense oriented sub-layer.

22. A piezoelectric assembly, comprising a base metal substrate having a main substrate surface;

a first oriented layer arranged on the main substrate surface, the first oriented layer comprises a first material of crystalline perovskite structure which constitutes at least 90 wt % of the first oriented layer; and a first piezoelectric layer is arranged on the first oriented layer, the first piezoelectric layer comprises a piezoelectric material of crystalline perovskite structure comprising lead, the piezoelectric material has a larger longitudinal piezoelectric coefficient (d33) along a direction of the unit cells of the piezoelectric material than the first material of the first oriented layer, and wherein a degree of orientation "o" of the piezoelectric material of the first piezoelectric layer is 90% or more, the degree of orientation "o" is the average degree of alignment of the direction of the unit cells of the crystalline piezoelectric material with a local surface normal "N" of the main substrate surface, wherein a second oriented layer consisting of the first material is arranged above the first piezoelectric layer, a second piezoelectric layer is arranged on the second oriented layer, wherein the second piezoelectric layer comprises the same piezoelectric material with the same degree of orientation "o" of 90% or more as the first piezoelectric layer, wherein the first oriented layer comprises a porous oriented sub-layer which has a porous structure with a relative porosity of up to 70%, wherein the first oriented layer further comprises a dense oriented sub-layer, the porous oriented sub-layer having a concentration of pores at least two times higher than a concentration of pores of the dense oriented sub-layer, and wherein the dense oriented sub-layer is arranged directly on the main substrate surface and the porous oriented sub-layer is arranged on the dense oriented sub-layer.

* * * * *